(12) United States Patent
Mecham et al.

(10) Patent No.: US 12,725,596 B2
(45) Date of Patent: Sep. 1, 2026

(54) THERMAL MANAGEMENT SYSTEMS WITH ACOUSTIC ISOLATION

(71) Applicant: NVIDIA CORPORATION, Santa Clara, CA (US)

(72) Inventors: William Mecham, Elk Grove, CA (US); Ryan Albright, Beaverton, OR (US); William Ryan Weese, Portland, OR (US); Benjamin Goska, Portland, OR (US); Aaron Carkin, Hillsboro, OR (US); Michael Thompson, Wilsonville, OR (US); Tahir Cader, Spokane Valley, WA (US); Jordan Levy, Portland, OR (US)

(73) Assignee: Nvidia Corporation, Santa Clara, CA (US)

( * ) Notice: Subject to any disclaimer, the term of this patent is extended or adjusted under 35 U.S.C. 154(b) by 240 days.

(21) Appl. No.: 18/195,073

(22) Filed: May 9, 2023

(65) Prior Publication Data

US 2024/0379084 A1 Nov. 14, 2024

(51) Int. Cl.
*H05K 7/20* (2006.01)
*G10K 11/16* (2006.01)

(52) U.S. Cl.
CPC ....... *G10K 11/161* (2013.01); *H05K 7/20727* (2013.01); *H05K 7/20772* (2013.01); *H05K 7/20836* (2013.01)

(58) Field of Classification Search
CPC ............. G10K 11/161; H05K 7/20727; H05K 7/20772; H05K 7/20836

(Continued)

(56) References Cited

U.S. PATENT DOCUMENTS 5,718,628 A * 2/1998 Nakazato ........... H05K 7/20745 236/49.5
5,822,188 A * 10/1998 Bullington ......... H05K 7/20145 361/695

(Continued)

OTHER PUBLICATIONS

Derjani-Bayeh, Sylvana et al., Chapter 16 Using Science Fiction in Chemical Engineering Education, [online] Innovations 2009 World Innovations in Engineering Education and Research, Jan. 2009, pp. 187-201, INEER. Retrieved from the internet <https://www.researchgate.net/publication/232806871_Chapter_16_Using_Science_Fiction_in_Chemical_Engineering_Education>.

(Continued)

*Primary Examiner* — Anatoly Vortman
(74) *Attorney, Agent, or Firm* — Alston & Bird LLP

(57) ABSTRACT

Thermal management systems and associated methods are provided with acoustic isolation. An example system includes a computing device that defines a first housing supporting one or more processing units and a thermal management system. The thermal management system includes a pressure generation mechanism and one or more cooling conduits operably coupled with the pressure generation mechanism, and the one or more cooling conduits provide fluid communication between the computing device and the pressure generation mechanism. The pressure generation mechanism causes circulation of cooling fluid to the computing device via the one or more cooling conduits so as to dissipate heat generated by the one or more processing units, and the pressure generation mechanism is acoustically isolated from the computing device.

20 Claims, 7 Drawing Sheets

(58) Field of Classification Search
USPC .......................................................... 361/695
See application file for complete search history.

(56) References Cited

U.S. PATENT DOCUMENTS

| | | | | |
|---|---|---|---|---|
| 6,374,627 | B1 * | 4/2002 | Schumacher | G06F 1/20 62/263 |
| 6,714,412 | B1 * | 3/2004 | Chu | H05K 7/2079 165/157 |
| 6,747,872 | B1 * | 6/2004 | Patel | G06F 1/206 62/263 |
| 7,057,506 | B2 * | 6/2006 | Bash | H05K 7/20745 340/506 |
| 7,330,350 | B2 * | 2/2008 | Hellriegel | H05K 7/20836 361/679.48 |
| 7,362,571 | B2 * | 4/2008 | Kelley | H05K 7/20745 361/695 |
| 7,500,911 | B2 * | 3/2009 | Johnson | H05K 7/20836 165/104.33 |
| 7,903,407 | B2 * | 3/2011 | Matsushima | H05K 7/20745 361/695 |
| 8,346,398 | B2 * | 1/2013 | Ahmed | H05K 7/20836 700/32 |
| 8,544,289 | B2 * | 10/2013 | Johnson | H05K 7/20836 62/186 |
| 8,919,143 | B2 * | 12/2014 | Eckberg | H05K 7/2079 62/263 |
| 10,162,396 | B2 * | 12/2018 | Cui | H05K 7/20772 |
| 10,306,809 | B1 * | 5/2019 | Totani | H05K 7/20836 |
| 10,569,905 | B2 * | 2/2020 | Tinde | B64F 1/362 |
| 10,842,052 | B2 * | 11/2020 | Gardner | H05K 7/20836 |
| 2001/0050480 | A1 * | 12/2001 | Gooch | B64F 1/362 285/260 |
| 2003/0067745 | A1 * | 4/2003 | Patel | H05K 7/20745 361/690 |
| 2004/0050231 | A1 * | 3/2004 | Chu | H05K 7/2079 30/317 |
| 2004/0065097 | A1 * | 4/2004 | Bash | H05K 7/20836 62/259.2 |
| 2007/0084163 | A1 * | 4/2007 | Lai | H05K 7/20181 55/385.6 |
| 2007/0117502 | A1 * | 5/2007 | Kim | H01L 23/467 257/E23.099 |
| 2008/0266794 | A1 * | 10/2008 | Malone | H05K 7/20836 361/689 |
| 2012/0279233 | A1 * | 11/2012 | Chainer | H05K 7/20254 62/3.6 |
| 2013/0088833 | A1 * | 4/2013 | Cox | H05K 7/20736 361/689 |
| 2014/0126151 | A1 * | 5/2014 | Campbell | H05K 7/2079 361/699 |
| 2014/0261701 | A1 * | 9/2014 | Deutsch | F24F 13/0218 138/119 |
| 2024/0049380 | A1 * | 2/2024 | Mohr | H05K 7/209 |

OTHER PUBLICATIONS

Polihronov, J. et al. The Maximum Coefficient of Performance (COP) of Vortex Tubes [online]. Canadian Journal of Physics. (2015) 93 (11): 1279-1282. Retrieved from the internet <doi:10.1139/cjp-2015-0089>.

Vortex tube—Wikipedia [online]. Retrieved from the internet <https://en.wikipedia.org/w/index.php?title=Vortex_tube&oldid=1137235635>.

Airtex.net, e-commerce site of Oil Service Srl. [online]. Retrieved from the internet <https://www.airtx.net/airtx-vortex-tubes-review>.

Lee, J.-Y, et al., Enhanced Heat-Electric Conversion via Photonic-Assisted Radiative Cooling [online]. Nanomaterials 2021, 11, 983. Retrieved from the Internet <doi.org/10.3390/nano11040983>.

Lim, X. "The Super-cool Materials That Send Heat To Space" [online]. Nature 577 (2020). Retrieved from the Internet <www.nature.com/articles/d41586-019-03911-8>.

24/7 Electricity-Free Cooling [online]. Retrieved from the Internet <www.skycoolsystems.com>.

Ganju et al., pending U.S. Appl. No. 63/352,250, filed Jun. 15, 2022.

Mohr et al., pending U.S. Appl. No. 17/879,620, filed Aug. 2, 2022.

Ruso et al., pending U.S. Appl. No. 17/892,283, filed Aug. 22, 2022.

Ganju et al., pending U.S. Appl. No. 17/935,511, filed Sep. 26, 2022.

Ruso et al., pending U.S. Appl. No. 17/968,447, filed Oct. 18, 2022.

Cader et al., pending U.S. Appl. No. 18/100,296, filed Jan. 23, 2023.

Cader et al., pending U.S. Appl. No. 18/118,958, filed Mar. 8, 2023.

* cited by examiner

THERMAL MANAGEMENT SYSTEMS WITH ACOUSTIC ISOLATION

TECHNOLOGICAL FIELD

Example embodiments of the present disclosure relate generally to computing systems and devices and, more particularly, to thermal management systems for computing systems and devices that provide acoustic isolation.

BACKGROUND

Servers, networking boxes, datacenter racks, and/or the like are often housed in datacenters or other similar large environments and rely upon various climate control systems and associated techniques to maintain acceptable operating temperatures. For example, a computing device (e.g., server) may include various processing units (e.g., graphics processing units (GPUs), central processing units (CPUs), data processing units (DPUs), and/or the like) that generate heat during operation. Applicant has identified a number of deficiencies and problems associated with conventional thermal management systems in these applications and others. Through applied effort, ingenuity, and innovation, many of these identified problems have been solved by developing solutions that are included in embodiments of the present disclosure, many examples of which are described in detail herein.

BRIEF SUMMARY

Apparatuses, systems, methods for thermal management systems with acoustic isolation are provided. An example system may include a computing device that defines a first housing supporting one or more processing unit and a thermal management system. The thermal management system may include a pressure generation mechanism and one or more cooling conduits operably coupled with the pressure generation mechanism. The one or more cooling conduits may provide fluid communication between the computing device and the pressure generation mechanism. The pressure generation mechanism may be configured to cause circulation of cooling fluid to the computing device via the one or more cooling conduits so as to dissipate heat generated by the one or more processing units. The pressure generation mechanism may be acoustically isolated from the computing device.

In some embodiments, the thermal management system may further include a second housing configured to support at least the pressure generation mechanism.

In some embodiments, the pressure generation mechanism may include an air compressor configured to cause air to be circulated via the one or more cooling conduits.

In some further embodiments, the thermal management system may further include a plenum assembly in fluid communication with the pressure generation mechanism and the one or more cooling conduits.

In some embodiments, the pressure generation mechanism may include a pump configured to cause liquid to be circulated via the one or more cooling conduits.

In some embodiments, the first housing may further include one or more engagement cages configured to be operably coupled with the one or more cooling conduits so as to establish fluid communication.

In some further embodiments, the one or more engagement cages may be further configured to be operably coupled with one or more fan assemblies.

In some further embodiments, additionally or alternatively, the one or more engagement cages may further include one or more locking mechanisms configured to removably attach the one or more cooling conduits with the one or more engagement cages.

In some further embodiments, additionally or alternatively, the one or more cooling conduits may include a plurality of cooling conduits and each of the plurality of cooling conduits may be configured to be operably coupled with respective engagement cages of the first housing.

In any embodiment, in operation, the sound level of an ambient environment proximate the computing device may be less than approximately 85 decibels.

In any embodiment, the system may further include a controller operably coupled with the computing device and the thermal management system. In such an embodiment, the controller may be configured to modify operation of the thermal management system in response to one or more characteristics of the computing device.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

Embodiments of the present disclosure now will be described more fully hereinafter with reference to the accompanying drawings in which some but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as “front,” “rear,” “top,” etc. are used for explanatory purposes in the examples provided below to describe the relative position of certain components or portions of components. Furthermore, as would be evident to one of ordinary skill in the art in light of the present disclosure, the terms “substantially” and “approximately” indicate that the referenced element or associated description is accurate to within applicable engineering tolerances.

Although described hereafter with reference to example datacenter implementations employing the thermal management systems of the present disclosure, the acoustic isolation techniques of the present disclosure may be equally applicable to other environments. For example, the thermal management systems described herein may be implemented in any environment in which the thermal burden experienced by components is managed and reduction of the sound level associated with the environment is beneficial. Furthermore, although described herein with reference to air and/or fluid based cooling techniques, the present disclosure contemplates that the thermal management systems described herein may leverage any mechanism for heat dissipation based upon the intended application of the thermal management system.

Example Computing Devices

Figure 1:
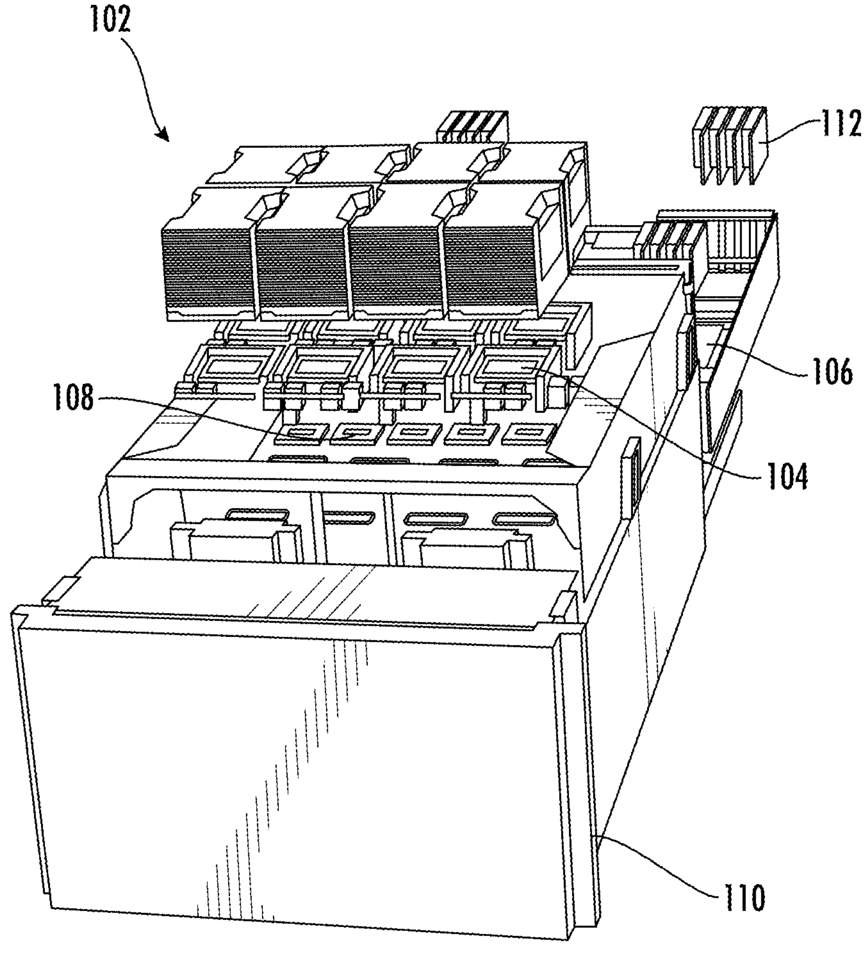
FIG. 1 illustrates an example computing device for use with one or more embodiments described herein.

As described above, servers, networking boxes, datacenter racks, and/or the like are often housed in datacenters or other similar large environments and rely upon various climate control systems and associated techniques to maintain acceptable operating temperatures. For example, a computing device (e.g., server) may include various processing units (e.g., graphics processing units (GPUs), central processing units (CPUs), data processing units (DPUs), and/or the like) that generate heat during operation. With reference to FIG. 1, for example, a computing device 102 for use with one or more embodiments described herein is illustrated. As shown, the computing device 102 may include various computing components, optoelectronic components, etc., such as one or more processing units 104. The one or more processing units 104 may, in some embodiments, be one or more GPUs configured to, at least in part, perform one or more operations associated with the computing device 102. The computing device 102 may further include one or more CPUs 106, switching devices 108, memory devices 110, and/or network interfaces 112 that facilitate performance of the one or more operations associated with the computing device 102. The present disclosure contemplates that the computing device 102 may include any components used for performing its associated operations, alternatively or in addition to these components illustrated in FIG. 1.

As would be evident to one of ordinary skill in the art in light of the present disclosure, the components implemented by the computing device 102 may generate heat during operation. As the thermal burden associated with the computing device 102 increases, however, the performance associated with the computing device 102 may be diminished. In order to reduce the thermal burden associated with computing devices, such as computing device 102 in FIG. 1, various thermal management systems and/or techniques may be used. In conventional systems, fan assemblies are often employed to dissipate heat and are physically attached to, for example, fan cages defined by housing of the computing device (e.g., the server housing). These fan assemblies, however, generate high sound levels that increase the overall sound level of the ambient environment of the computing device (e.g., datacenter or the like). In some instances, the sound produced by these fan assemblies may exceed 95 dB, a sound level that may be damaging to users or operators that enter the datacenter environment (e.g., performing server maintenance or otherwise).

In order to address these issues and others, the embodiments of the present disclosure provide thermal management systems for datacenter implementations that acoustically isolate some portion of the thermal management system in order to reduce the noise level proximate the computing device (e.g., server). For example, a thermal management system may include a pressure generation mechanism (e.g., an air compressor, liquid pump, etc.) and cooling conduits (e.g., channels, pipes, etc.) that may be attached to the pressure generation mechanism and the housing of the server. In particular, the cooling conduits may operate as “drop-in” replacements for conventional fan cage assemblies so as to retrofit computing devices without modification to their associated housing structure. The pressure generation mechanism may be disposed within a second housing (e.g., separate room or location) such that the sound generated by such a mechanism is distanced from the physical location at which an operator will be located. In doing so, the embodiments of the present disclosure may reduce the sounds level associated with conventional datacenter environments while maintaining appropriate thermal management (e.g., heat dissipation) capabilities.

Example Thermal Management Systems with Acoustic Isolation

Figure 2A:
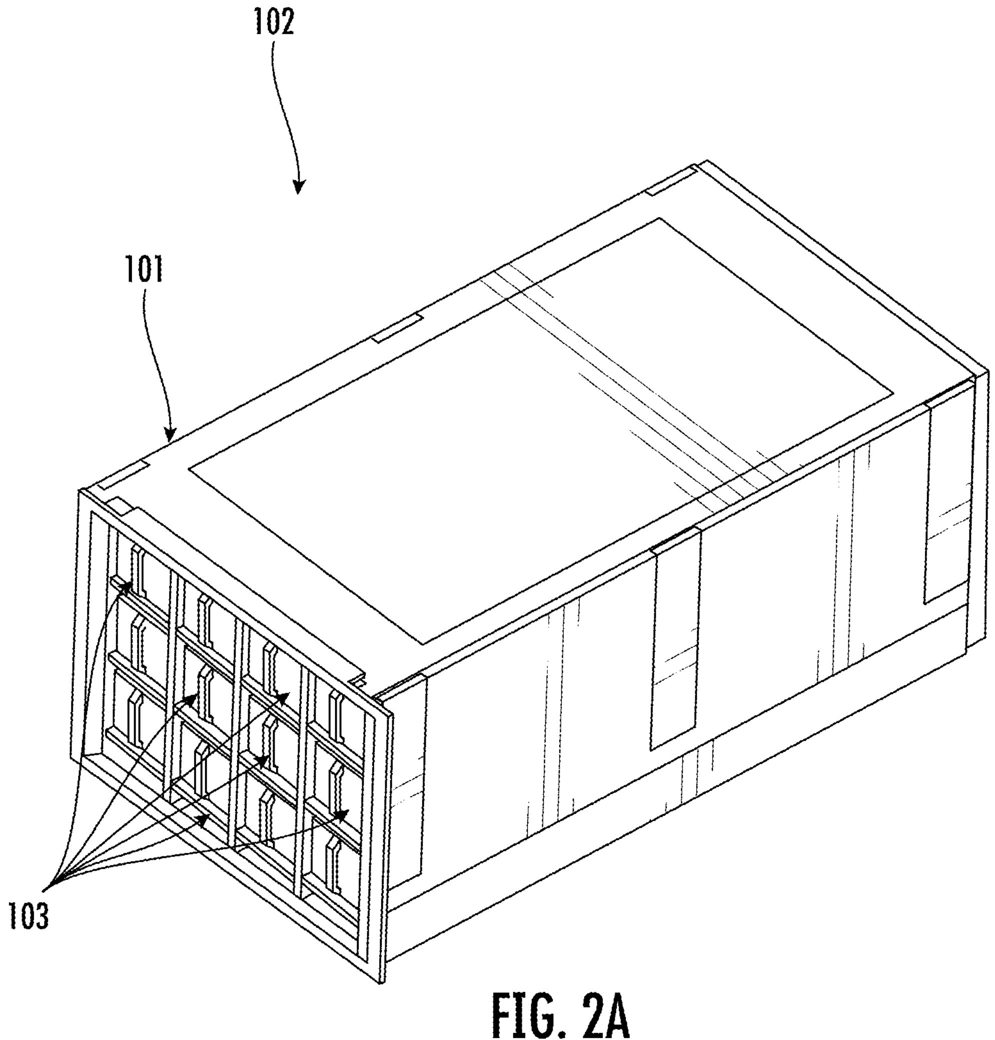
FIGS. 2A-2B illustrate an example perspective and exploded view, respectively, of the housing of the example computing device of FIG. 1 in accordance with some embodiments described herein.
Figure 2B:
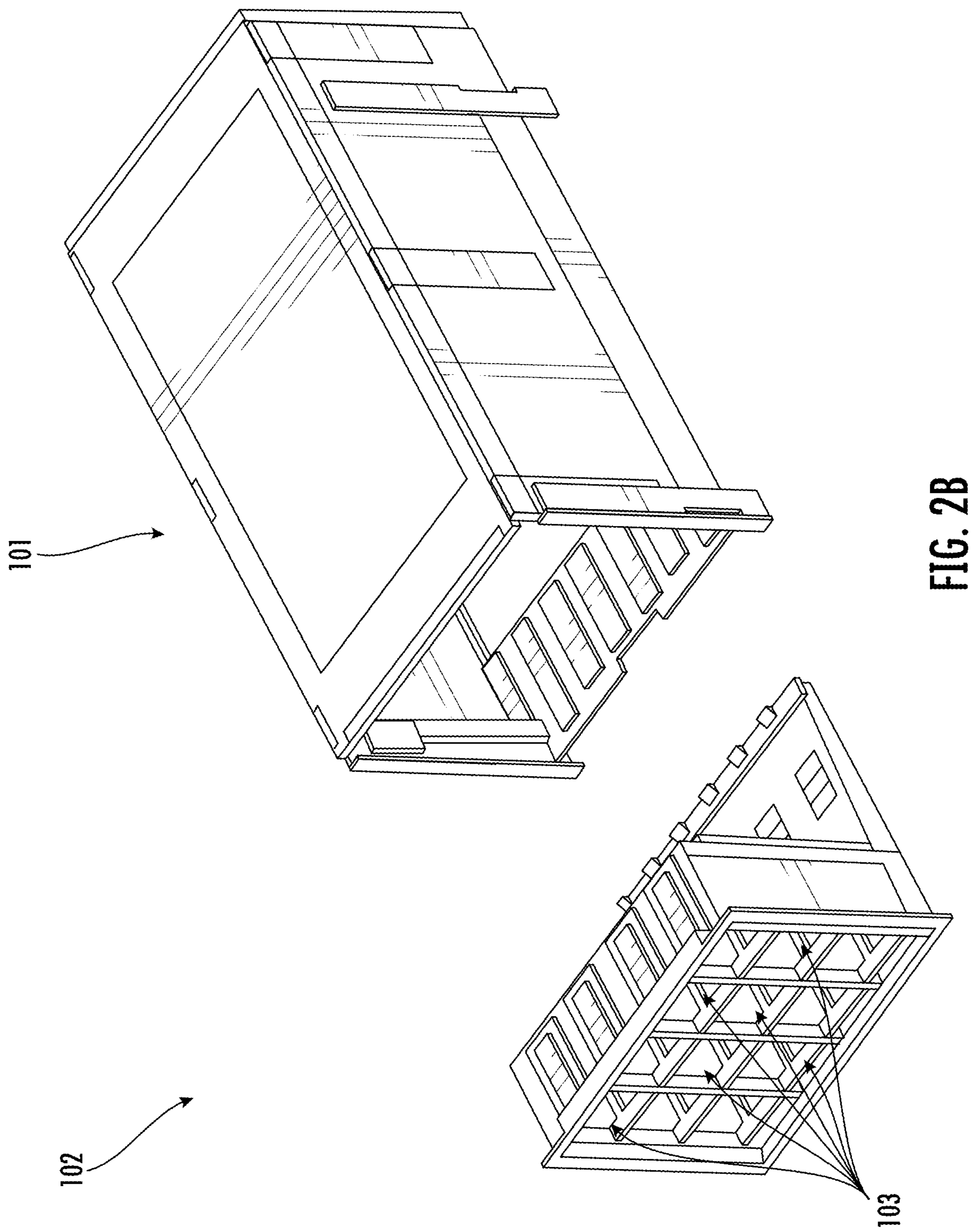
Figure 3:
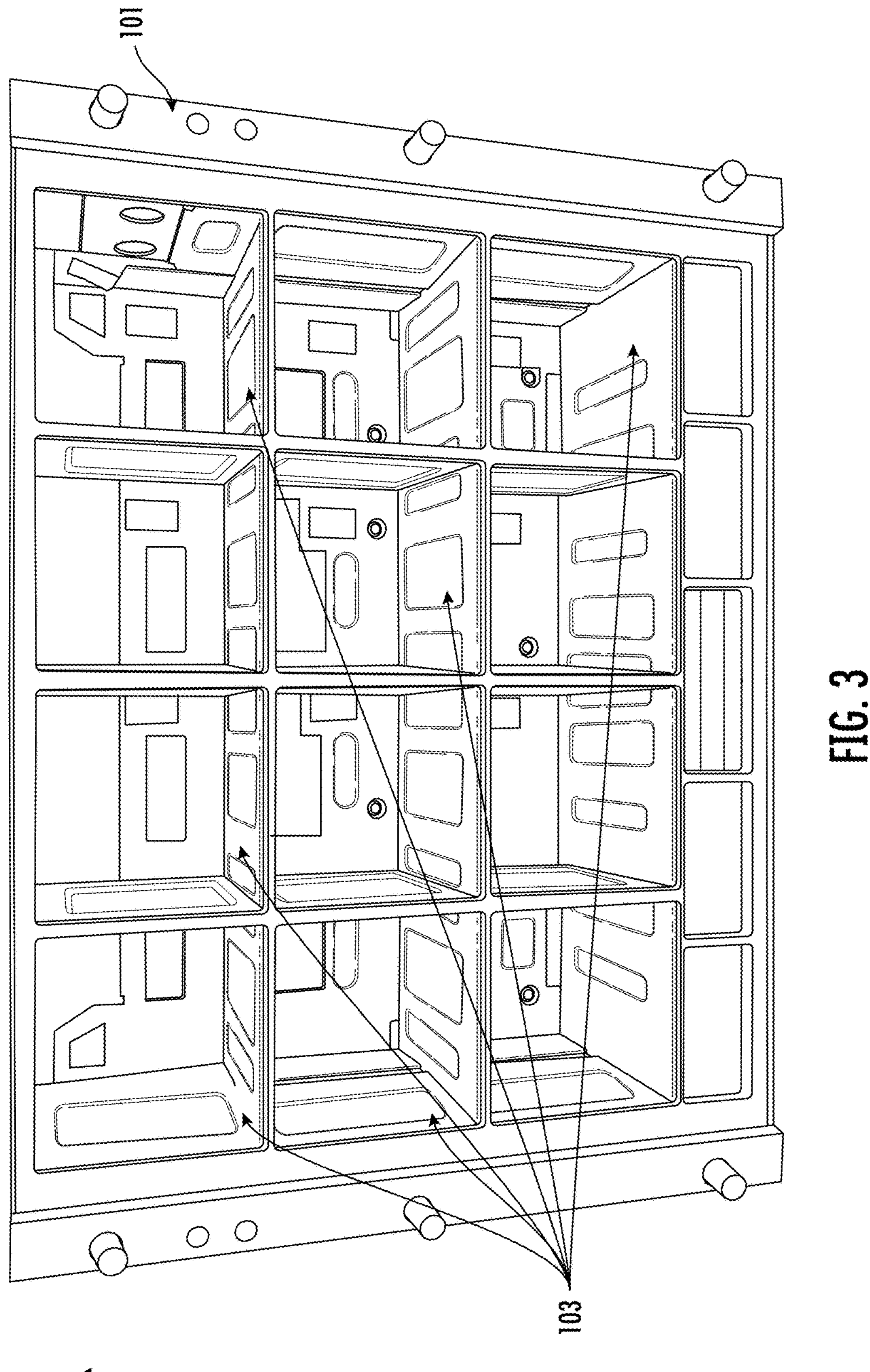
FIG. 3 illustrates one or more engagements cages of the housing of FIGS. 1-2B in accordance with some embodiments described herein.

With reference to FIGS. 2A, 2B, and 3, an example computing device 102 and associated first housing 101 are illustrated. As shown, the first housing 101 may refer to the enclosure, container, etc. configured to at least partially support the components of the computing device 102 therein, such as these components illustrated in FIG. 1. By way of a particular example, the first housing 101 of the computing device 102 may support one or more processing units (e.g., GPUs 104 illustrated in FIG. 1). The first housing 101 may, a shown, be formed having a rectangular cross-section. The present disclosure, however, contemplates that the dimensions (e.g., size and shape) of the first housing 101 may vary based upon the intended application of the computing device 102. By way of example, the dimensions of the first housing 101 may increases as the number of processing units supported by the first housing 101 increases. Similarly, the shape and/or orientation of the first housing 101 may be at least partially determined by the structure that supports the first housing 101 during operation (e.g., a datacenter rack or the like).

The first housing 101 may further define one or more engagement cages 103 as shown in FIGS. 2A-3. As described above, conventional attempts at dissipating heat rely upon fan assemblies (e.g., see fan assembly 300 in FIG. 4) that are removably attached with respective engagement cages 103 formed by the first housing 101. As such, the one or more engagement cages 103 may be configured to at least partially receive a fan assembly disposed therein. In this way, the one or more engagement cages 103 may refer to any housing, container, enclosure, and/or the like by which an example fan assembly may be secured to or supported by the first housing 101. As described hereafter with reference to FIGS. 5-6, the one or more engagement cages 103 may be configured to be operably coupled with the one or more cooling conduits of the thermal management system with acoustic isolation of the present disclosure.

As would be evident to one of ordinary skill in the art in light of the thermal management operations enabled by the one or more engagement cages 103, the structure of the one or more engagement cages 103 may enable fluid communication between an interior of the first housing 101 and an ambient environment of the first housing 101. As shown in FIG. 3, for example, the one or more engagement cages 103 may define openings through which air and/or fluid may be directed. The present disclosure contemplates that the dimensions (e.g., size and shape) orientation, arrangement, configuration, number, and/or the like associated with the one or more engagement cages 103 may vary based upon the computing device 102 associated with the first housing 101. By way of non-limiting example, as the processing power associated with the computing device 102 (e.g., via an increased number of GPUs 104, GPUs with increased processing power, etc.), the number of engagement cages 103 may increase to support an increase in the number of mechanisms for dissipating this increased thermal burden. As shown in FIG. 2B, the one or more engagement cages 103 may be removably attached with the first housing 101, such as to provide access to the interior of the first housing 101.

Figure 4:
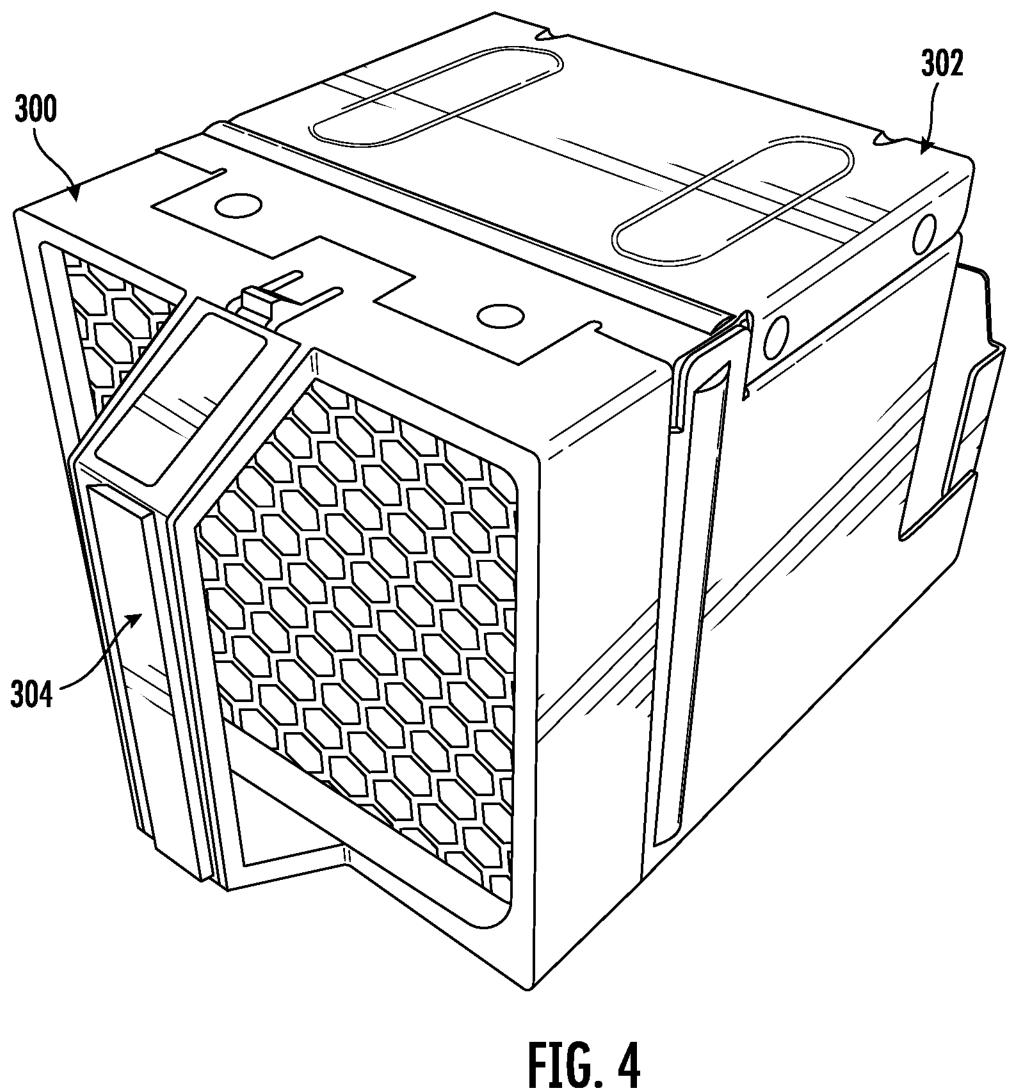
FIG. 4 illustrates an example fan assembly for use with some embodiments described herein.

With reference to FIG. 4, an example fan assembly 300 is illustrated. As shown, the fan assembly 300 may define a first end 302 that is configured to be positioned within the one or more engagement cages 103 in an instance in which the fan assembly 300 is engaged with the first housing 101. The fan assembly 300 may similarly define a second end 304 opposite the first end 302 that extends beyond a peripheral edge of the one or more engagement cages 103 so as to allow a user to remove the fan assembly 300 (e.g., for maintenance, replacement, etc.). By way of a particular example, the fan assembly 300 may have dimensions that are complementary to at least one of the one or more engagement cages 103. In such an example, a user or operator associated with the present systems may insert the first end 302 of the fan assembly 300 into the engagement cage 103. As described above, however, fan assemblies may generate high sound levels that increase the overall sound level of the ambient environment of the computing device 102. Although described hereafter with reference to thermal management systems that employ cooling conduits coupled with the one or more engagement cages 103 to dissipate heat, the present disclosure contemplates that, in some embodiments, at least a portion of the one or more engagement cages may also receive fan assemblies 300 (e.g., a hybrid implementation).

Figure 5:
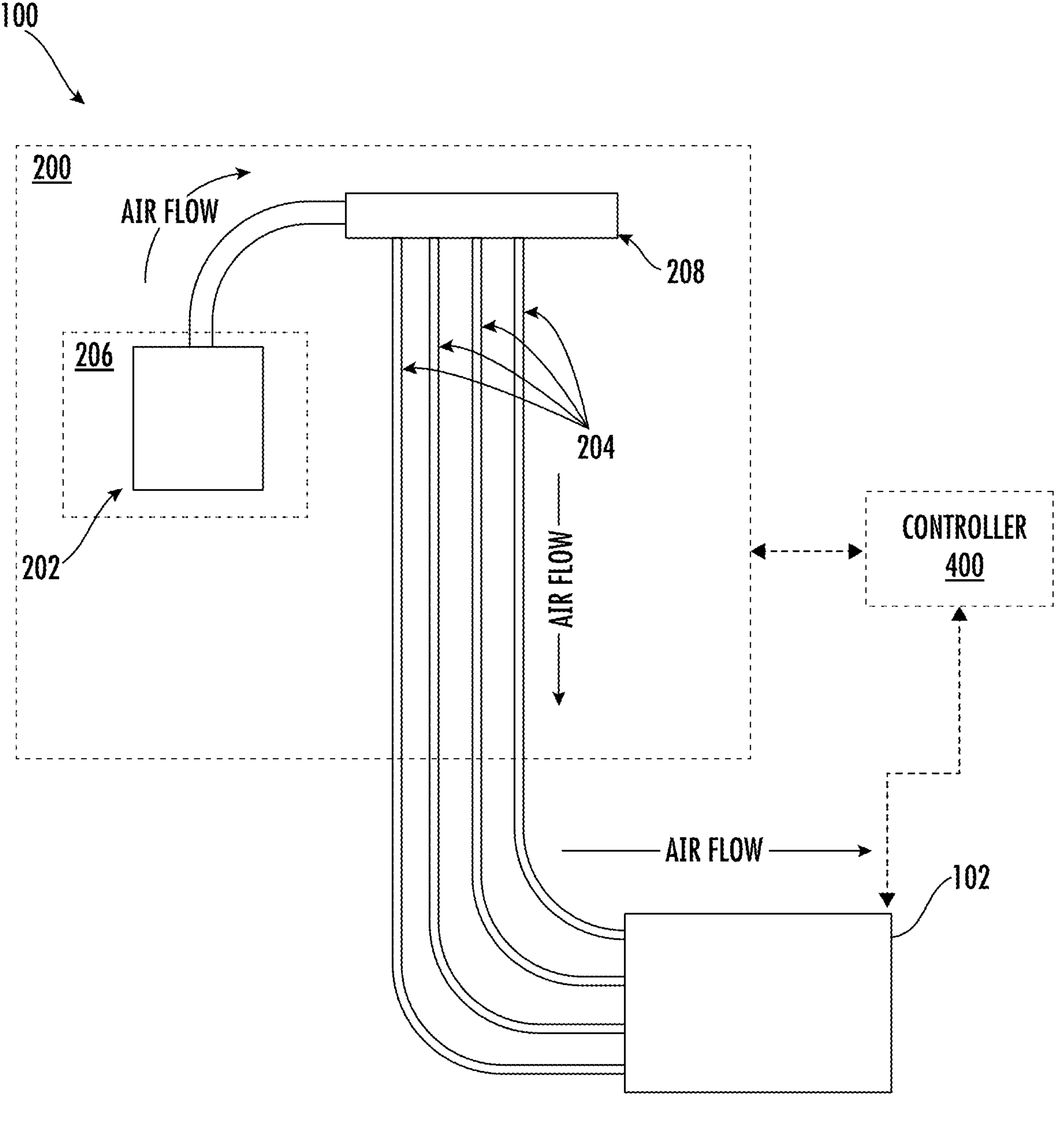
FIG. 5 illustrates an example thermal management system in accordance with some embodiments described herein.
Figure 6:
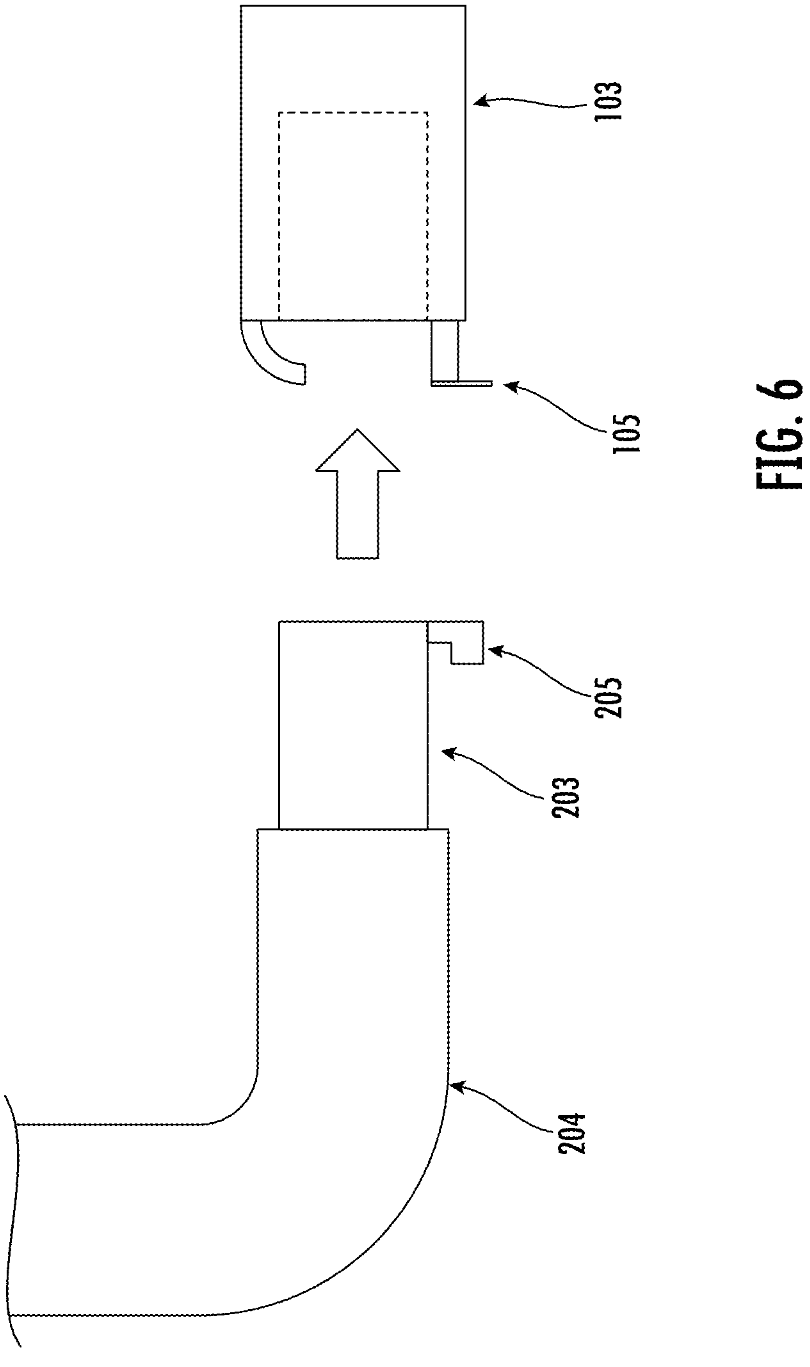
FIG. 6 illustrates an example locking mechanism for user with some example embodiments described herein.

With reference to FIGS. 5-6, an example system 100 of the present disclosure is illustrated (e.g., system 100). As shown, the system 100 may include the computing device 102 described above with reference to FIGS. 1-2A that includes a first housing 101 and one or more processing units 104 (e.g., GPUs 104) and a thermal management system 200. The thermal management system 200 may include a pressure generation mechanism 202 and one or more cooling conduits 204 operably coupled with the pressure generation mechanism 202. The pressure generation mechanism 202 may refer to any device (or collection of devices) configured to drive, force, propel, or otherwise cause cooling fluid (e.g., air or liquid) to be directed to the computing device 102 via the one or more cooling conduits 204 as described hereafter. Although illustrated and described herein with reference to a single pressure generation mechanism 202 associated with a particular computing device 102, the present disclosure contemplates that any number of pressure generation mechanism(s) 202 may be associated with the same computing device 102 and/or multiple computing device(s) 102. By way of a non-limiting example, the pressure generation mechanism 202 may be configured to cause cooling fluid (e.g., air or liquid) to be directed to multiple computing devices 102 via respective cooling conduits 204.

By way of example, the pressure generation mechanism 202 may, in some embodiments, include an air compressor configured to cause air to be circulated via the one or more cooling conduits 204. As would be evident to one of ordinary skill in the art in light of the present disclosure, an air compressor may refer to any pneumatic device that converts power into stored pressurized or compressed air. As such, the example air compressor described herein may refer to any positive displacement compressor (e.g., piston-type, rotary screw, vane, and/or the like), roto-dynamic or turbo compressor (e.g., centrifugal, axial, and/or the like), etc. based upon the intended application of the system 100. In other words, an example air compressor acting as the pressure generation mechanism 202 may refer to any device, system, etc. that is configured to, via an air pressure differential, cause circulation of air used for dissipating heat generated by the computing device 102.

By way of example, the pressure generation mechanism 202 may, in some embodiments, include a pump configured to cause liquid to be circulated via the one or more cooling conduits 204. As would be evident to one of ordinary skill in the art in light of the present disclosure, a pump may refer to any device that converts power into hydraulic energy. As such, the example pump described herein may refer to any positive-displacement pump, impulse pump, velocity pump, gravity pump, steam pump, valveless pumps, centrifugal pump, and/or axial-flow pump based upon the intended application of the system 100. In other words, an example pump acting as the pressure generation mechanism 202 may refer to any device, system, etc. that is configured to, via a fluid/liquid pressure differential, cause circulation of fluid/liquid used for dissipating heat generated by the computing device 102. Although described herein with reference to pressure generation mechanisms 202 that include air compressors and/or pumps, the present disclosure contemplates that any device that is configured to, via a fluid/liquid pressure differential, cause circulation of fluid/liquid used for dissipating heat generated by the computing device 102 may be used.

The one or more cooling conduits 204 may refer to the structure by which the cooling fluid (e.g., air or liquid) is provided from the pressure generation mechanism 202 to the computing device 102. As shown in FIG. 5, the one or more cooling conduits 204 may be operably coupled with the pressure generation mechanism 202 and provide fluid communication between the computing device 102 and the pressure generation mechanism 202. The one or more cooling conduits 204 may therefore define respective channels, pipes, tubes, and/or the like configured to house air and/or liquid therein. The one or more cooling conduits 204 may be configured to, on one end, engage the pressure generation mechanism 202, and, on an opposing end as described hereafter with reference to FIG. 6, engage the computing device 102. In an instance in which the pressure generation mechanism 202 is an air compressor, the one or more cooling conduits 204 may receive pressurized air from the pressure generation mechanism 202 and direct this air to the computing device 102. In an instance in which the pressure generation mechanism 202 is a fluid/liquid pump, the one or more cooling conduits 204 may receive fluid/liquid from the pressure generation mechanism 202 and direct this fluid/liquid to the computing device 102. The present disclosure contemplates that the thermal management system 200 may leverage any number of cooling conduits 204 (e.g., a plurality of cooling conduits 204) at any location or orientation based upon the intended application of the thermal management system 200. In some embodiments, the number of cooling conduits 204 may be substantially the same as the number of engagement cages 103 associated with the computing device 102.

In some embodiments, the thermal management system 200 may further include a plenum assembly 208 in fluid communication with the pressure generation mechanism 202 and the one or more cooling conduits 204. The plenum assembly 208 may refer to a pressurized housing that is configured to contain air or fluid at a positive pressure. As would be evident to one of ordinary skill in the art in light of the present disclosure, the plenum assembly 208 may operate to equalize pressure for equal distribution to the one or more cooling conduits 204. For example, the plenum assembly 208 may be disposed between the pressure generation mechanism 202 and the one or more cooling conduits 204 such that the air or fluid/liquid that is driven by the pressure generation mechanism 202 is received by the plenum assembly 208 for distribution to the one or more cooling conduits 204. Although described herein with reference to a plenum assembly 208, the present disclosure contemplates that any device or structure (e.g., manifold, pressurized container, etc.) may be used based upon the intended application of the thermal management system 200. As described hereinafter, the plenum assembly 208 may facilitate modification of the cooling supplied to the computing device 102 by the thermal management system 200 in response to one or more characteristics of the computing device 102.

As described above, traditional systems that use fan assemblies (e.g., fan assembly 300 in FIG. 4) for heat dissipation that are directly mounted to the computing device 102 (e.g., the one or more engagement cages 103) generate substantial noise that may be damaging to users or operators. To acoustically isolate the portion (e.g., the pressure generation mechanism 202) of the thermal management system 200 associated with increased noise, the system 100 may include a second housing 206 configured to support the pressure generation mechanism 202. As shown, the second housing 206 may be positioned remote (e.g., sufficiently distant) from the computing device 102 so as to reduce the sound level of an ambient environment proximate the computing device 102. By way of a non-limiting example, the acoustic isolation provided by the embodiments described here may be such that the ambient environment proximate the computing device 102 is less than approximately 85 decibels.

In some embodiments, the second housing 206 that supports the pressure generation mechanism 202 may be positioned at a second location that is different from the first location at which the computing device 102 is positioned. For example, the computing device 102 may be positioned within a rack of a datacenter environment, and the second housing 206 may be located in a separate environment (e.g., a maintenance location or the like). In doing so, the noise generated by the pressure generation mechanism 202 may be acoustically isolated from the computing device 102 to allow for users to interact with the computing device 102 without personal protective equipment (PPE) in a reduced sound-level environment. In some embodiments, the second housing 206 may be acoustically insulated (e.g., soundproofed) or otherwise formed of a material that is resistant to the passage of sound waves. In doing so, the second housing 206 may operate to acoustically isolate the pressure generation mechanism 202 from the computing device 102 and its ambient environment regardless of the location of the second housing 206. The present disclosure contemplates that the thermal management system 200 may leverage any technique for acoustically isolating the pressure generation mechanism 202 from the computing device 102.

With reference to FIG. 6, an example engagement between the cooling conduit 204 and the engagement cage 103 is illustrated. As described above, the one or more engagements cages 103 of the first housing 101 of the computing device 102 may be configured to interface with respective fan assemblies 300 in conventional implementations. In order to enable fluid communication between the cooling conduits 204 and the computing device 102 without need for modification to the first housing 101 (e.g., a retrofit operation), the cooling conduits 204 may be at least partially received by the one or more engagement cages 103. Said differently, the engagement cages 103 of the present disclosure may be capable of connecting with fan assemblies 300 and/or cooling conduits 204.

As shown, at least a portion 203 of the cooling conduit 204 may be configured to be at least partially inserted into the engagement cage 103. By way of example, an end of the cooling conduit 103 that is configured to interface with the first housing 101 of the computing device 102 (e.g., opposite an end that interfaces with the pressure generation mechanism 202) may have dimensions that are complementary to the dimensions of a cavity defined by the engagement cage 103. The portion 203, for example, may refer to a segment of the cooling conduit 204 that has a cross-sectional area that is smaller than a cross-sectional area associated with the remainder of the cooling conduit 204. In operation, the portion 203 of the cooling conduit 204 may be inserted into the engagement cage 103 so as to establish fluid communication between the cooling conduit 204 and the engagement cage 103. In order to secure the cooling conduit 204 with the engagement cage 103, the engagement cage 103 may define one or more locking mechanisms 105/205 configured to removably attach the cooling conduit 204 with the engagement cage 103. For example, each of the engagement cages 103 may define a locking mechanism 105 that may be configured to interface with a corresponding locking mechanism or latch 205 of the respective cooling conduit 204. The present disclosure contemplates that cooling conduit 204 and/or the engagement cages 103 may define any mechanism for engagement based upon the intended application of the system 100.

Example Controller

As would be evident to one of ordinary skill in the art in light of the present disclosure, the computing device 102 may be associated with various characteristics, attributes, parameters, etc. that dynamically change during operation. By way of a non-limiting example, the thermal burden associated with the computing device 102 may increase/decrease in response to changes in environmental conditions, in processing load, and/or the like. Furthermore, these changes in the thermal burden may be localized or otherwise vary based upon the particular location within the computing device 102. For example, the temperature of a particular processing unit (e.g., a particular GPU 104) may be increased relative to other processing units due to the processing performed by the particular processing unit. As such, the system 100 of the present disclosure may, in some embodiments, include a controller 400 that may be configured to modify operation of the thermal management system 200 in response to one or more characteristics of the computing device 102.

As such, the controller 400 may include circuitry, networked processors, or the like configured to perform some or all of the apparatus-based (e.g., thermal management-based) processes described herein and may be any suitable controller, network card, graphical processing unit (GPU), microcontroller, computing device, network server, and/or other type of processing device. In this regard, the controller 400 may be embodied by any of a variety of devices. For example, the controller 400 may be configured to receive/transmit data and may include any of a variety of fixed terminals, such as a server, microcontroller, desktop, or kiosk, or it may comprise any of a variety of mobile terminals, such as a portable digital assistant (PDA), mobile telephone, smartphone, laptop computer, tablet computer, or in some embodiments, a peripheral device that connects to one or more fixed or mobile terminals.

The controller 400 may include a processor, a memory, communications circuitry, input/output circuitry, and/or the other circuitry components for monitoring various characteristics of the computing device 102 and modifying operation of the thermal management system 200 in response to these characteristics. The use of the term "circuitry" as used herein includes particular hardware configured to perform the functions associated with respective circuitry described herein. In some embodiments, various elements or components of the circuitry of the controller 400 may be housed by the computing device 102. It will be understood in this regard that some of the components described in connection with the controller 400 may be housed within one of these devices, while other components may be housed within another of these devices, or by yet another device not expressly illustrated in FIGS. 1-6.

In some embodiments, the controller 400 may include or otherwise be operably coupled with one or more sensor devices configured to determine the characteristics of the computing device 102. By way of example, the controller 400 may be configured to receive data from one or more sensors indicative of the temperature associated with each of the one or more processing units (e.g., GPUs 104). Although described herein with reference to temperature as an example characteristic of the computing device 102, the present disclosure contemplates that the thermal management system 200 may be configured to modify its operation in response to any characteristic of the computing device 102.

As described above, the controller 400 may include a processor (and/or co-processor or any other processing circuitry assisting or otherwise associated with the processor) that may be in communication with the memory via a bus for passing information among components of the controller 400. The memory may be non-transitory and may include, for example, one or more volatile and/or non-volatile memories. For example, the memory may be an electronic storage device (e.g., a non-transitory computer readable storage medium). The memory may be configured to store information, data, content, applications, instructions, or the like, for enabling the controller 400 to carry out various functions in accordance with example embodiments of the present disclosure. The processor may be embodied in a number of different ways and may, for example, include one or more processing devices configured to perform independently. Additionally, or alternatively, the processor may include one or more processors configured in tandem via a bus to enable independent execution of instructions, pipelining, and/or multithreading. The use of the term "processing circuitry" may be understood to include a single core processor, a multi-core processor, multiple processors internal to the security circuitry, and/or remote or "cloud" processors.

In an example embodiment, the processor may be configured to execute instructions stored in the memory or otherwise accessible to the processor. Alternatively, or additionally, the processor may be configured to execute hard-coded functionality. As such, whether configured by hardware or by a combination of hardware with software, the processor may represent an entity (e.g., physically embodied in circuitry) capable of performing operations according to an embodiment of the present disclosure while configured accordingly. Alternatively, as another example, when the processor is embodied as an executor of software instructions, the instructions may specifically configure the processor to perform the algorithms and/or operations described herein when the instructions are executed.

Of course, while the term "circuitry" should be understood broadly to include hardware, in some embodiments, the term "circuitry" may also include software for configuring the hardware. For example, although "circuitry" may include processing circuitry, storage media, network interfaces, input/output devices, and the like, other elements of the controller 400 may provide or supplement the functionality of particular circuitry.

As used herein, the term "computer-readable medium" refers to non-transitory storage hardware, non-transitory storage device or non-transitory computer system memory that may be accessed by a controller, a microcontroller, a computational system or a module of a computational system to encode thereon computer-executable instructions or software programs. A non-transitory "computer-readable medium" may be accessed by a computational system or a module of a computational system to retrieve and/or execute the computer-executable instructions or software programs encoded on the medium. Exemplary non-transitory computer-readable media may include, but are not limited to, one or more types of hardware memory, non-transitory tangible media (for example, one or more magnetic storage disks, one or more optical disks, one or more USB flash drives), computer system memory or random-access memory (such as, DRAM, SRAM, EDO RAM), and the like.

Example Method of Thermal Management System Modification

As described above with reference to the controller 400, the thermal management system 200 may be configured to modify operation of the thermal management system 200 in response to one or more characteristics of the computing device 102. For example, the controller 400 may receive data indicative of the one or more characteristics of the computing device 102. The receipt of this data may occur iteratively (e.g., based upon sensor sampling rate or the like) and/or in response to a determination that the characteristics have satisfied a particular threshold. By way of a non-limiting example, the controller 400 may receive data indicative of the temperature of at least one processing unit (e.g., GPU 104) in an instance in which the temperature of the processing unit meets or exceeds a temperature threshold.

Thereafter, the controller 400 may modify the thermal management system 200 to address this characteristic. By way of example, the controller 400 may receive data indicative of an increased temperature of one or more processing units (e.g., GPU 104) and direct the pressure generation mechanism 202 to increase the cooling provided via the cooling conduits 204 to the computing device 102. The present disclosure contemplates that the thermal management system 200 may modify the temperature of the air/liquid that is circulated via the cooling conduits 204, modify the flow rate of the air/liquid that is circulated via the cooling conduits 204, and/or the like. In some embodiments, the thermal management system 200 may be configured to selectively cool portions or particular components of the computing device 102. By way of example, the one or more cooling conduits 204 may be associated with respective blast gates, valve systems, and/or the like that allow the controller 400 to selectively modify the cooling that is provided by the particular cooling conduits 204. The present disclosure contemplates that the thermal management system 200 may employ any mechanism for dynamically modifying the cooling supplied to the computing device 102 based upon the intended application of the system 100.

Many modifications and other embodiments of the present disclosure set forth herein will come to mind to one skilled in the art to which these embodiments pertain having the benefit of the teachings presented in the foregoing descriptions and the associated drawings. Although the figures only show certain components of the methods and systems described herein, it is understood that various other components may also be part of any optical component or optoelectronic element. In addition, the method described above may include fewer steps in some cases, while in other cases may include additional steps. Modifications to the steps of the method described above, in some cases, may be performed in any order and in any combination.

Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A system comprising:

a computing device, wherein the computing device defines a first housing supporting one or more processing units and defining one or more engagement cages each positioned with a corresponding one of the one or more processing units; and a thermal management system comprising:

a pressure generation mechanism; and one or more cooling conduits operably coupled with the pressure generation mechanism, wherein the one or more cooling conduits provide fluid communication between the computing device and the pressure generation mechanism, wherein the pressure generation mechanism is configured to cause circulation of cooling fluid to the computing device via the one or more cooling conduits so as to dissipate heat generated by the one or more processing units, wherein the pressure generation mechanism is acoustically isolated from the computing device, wherein the one or more engagement cages are defined at respective physical interfaces between the one or more cooling conduits and the first housing of the computing device and are configured to removably attach the one or more cooling conduits with the first housing of the computing device.

2. The system of claim 1, wherein the thermal management system further comprises a second housing configured to support at least the pressure generation mechanism.

3. The system of claim 1, wherein the pressure generation mechanism comprises an air compressor configured to cause air to be circulated via the one or more cooling conduits.

4. The system of claim 3, wherein the thermal management system further comprises a plenum assembly in fluid communication with the pressure generation mechanism and the one or more cooling conduits.

5. The system of claim 1, wherein the pressure generation mechanism comprises a pump configured to cause liquid to be circulated via the one or more cooling conduits.

6. The system of claim 1, wherein the one or more engagement cages are further configured to be removably attached with one or more fan assemblies at a physical interface between the one or more fan assemblies and the first housing of the computing device.

7. The system of claim 1, wherein the one or more engagement cages further comprise one or more locking mechanisms configured to removably attach the one or more cooling conduits with the one or more engagement cages.

8. The system of claim 1, wherein the one or more cooling conduits comprise a plurality of cooling conduits and wherein each of the plurality of cooling conduits is configured to be removably coupled with respective engagement cages of the first housing.

9. The system of claim 1, further comprising a controller operably coupled with the computing device and the thermal management system, the controller configured to modify operation of the pressure generation mechanism in response to one or more characteristics of the one or more processing units of the computing device.

10. The system of claim 1, wherein at least one of the one or more cooling conduits is configured to be removably attached with the one or more engagement cages in an absence of a fan assembly at the physical interface between the first housing and the at least one of the one or more cooling conduits.

11. The system of claim 8, wherein at least one of the plurality of cooling conduits is configured to be removably attached with one of the one or more engagement cages in an absence of a fan assembly at the physical interface between the first housing and the at least one of the one or more cooling conduits.

12. The system of claim 8, wherein each of the plurality of cooling conduits comprises physically separate hose assemblies.

13. The system of claim 8, wherein each of the plurality of cooling conduits is fluidically isolated from one another at the physical interface between each of the plurality of cooling conduits and the first housing.

14. A thermal management system comprising:

a pressure generation mechanism; and one or more cooling conduits operably coupled with the pressure generation mechanism, wherein the one or more cooling conduits provide fluid communication between a computing device defining a first housing supporting one or more processing units and defining one or more engagement cages each positioned with a corresponding one of the one or more processing units and the pressure generation mechanism, wherein the pressure generation mechanism is configured to cause circulation of cooling fluid to the computing device via the one or more cooling conduits so as to dissipate heat generated by the one or more processing units, wherein the pressure generation mechanism is acoustically isolated from the computing device, wherein the one or more engagement cages are defined at respective physical interfaces between the one or more cooling conduits and the first housing of the computing device and are configured to removably attach the one or more cooling conduits with the first housing of the computing device.

15. The thermal management system of claim 14, further comprising a second housing configured to support at least the pressure generation mechanism.

16. The thermal management system of claim 14, wherein the pressure generation mechanism comprises an air compressor configured to cause air to be circulated via the one or more cooling conduits.

17. The thermal management system of claim 16, further comprising a plenum assembly in fluid communication with the pressure generation mechanism and the one or more cooling conduits.

18. The thermal management system of claim 14, wherein the pressure generation mechanism comprises a pump configured to cause liquid to be circulated via the one or more cooling conduits.

19. The thermal management system of claim 14, wherein the one or more engagement cages are further configured to be removably attached with one or more fan assemblies at a physical interface between the one or more fan assemblies and the first housing of the computing device.

20. The thermal management system of claim 14, wherein, in operation, a sound level of an ambient environment proximate the computing device is less than approximately 85 decibels.

* * * * *